United States Patent
Yamada et al.

(10) Patent No.: US 10,035,685 B2
(45) Date of Patent: Jul. 31, 2018

(54) MONITORING SYSTEM FOR A PASSENGER CONVEYOR

(71) Applicant: Otis Elevator Company, Farmington, CT (US)

(72) Inventors: Atsushi Yamada, Narita (JP); Hiromitsu Miyajima, Inzai (JP)

(73) Assignee: OTIS ELEVATOR COMPANY, Farmington, CT (US)

( * ) Notice: Subject to any disclaimer, the term of this patent is extended or adjusted under 35 U.S.C. 154(b) by 0 days.

(21) Appl. No.: 15/206,502

(22) Filed: Jul. 11, 2016

(65) Prior Publication Data
US 2018/0009639 A1    Jan. 11, 2018

(51) Int. Cl.
*G01R 31/34* (2006.01)
*B66B 27/00* (2006.01)
*B66B 25/00* (2006.01)

(52) U.S. Cl.
CPC ............. *B66B 27/00* (2013.01); *B66B 25/00* (2013.01); *B66B 25/006* (2013.01); *G01R 31/34* (2013.01)

(58) Field of Classification Search
CPC .... G01R 31/34; G01R 22/063; G01R 31/021; B66B 27/00; B66B 25/006
USPC .. 324/765.01, 600, 500, 538–545, 163, 160, 324/529, 139–143, 177, 179
See application file for complete search history.

(56) References Cited

U.S. PATENT DOCUMENTS

| | | | |
|---|---|---|---|
| 7,073,633 B2 | 7/2006 | Weinberger et al. | |
| 2006/0144646 A1 | 7/2006 | Engel et al. | |
| 2008/0230326 A1* | 9/2008 | Tyni ...................... | B66B 5/0031 187/393 |
| 2011/0056226 A1 | 3/2011 | Okubo et al. | |

(Continued)

FOREIGN PATENT DOCUMENTS

| | | |
|---|---|---|
| CN | 1994847 A | 7/2007 |
| CN | 101607668 A | 12/2009 |

(Continued)

OTHER PUBLICATIONS

PCT International Search Report and Written Opinion; Application No. PCT/US2017/041450; dated Nov. 22, 2017; 15 pages.

(Continued)

*Primary Examiner* — Melissa Koval
*Assistant Examiner* — Trung Nguyen
(74) *Attorney, Agent, or Firm* — Cantor Colburn LLP (57) ABSTRACT

A monitoring system for a passenger conveyor is provided. The passenger conveyor includes a motor for driving the passenger conveyor and an inverter for supplying current to the motor. The monitoring system includes a current sensor for detecting the current supplied to the motor; a temperature sensor for detecting the temperature of the motor; a data collecting device for receiving detected data from the current sensor and the temperature sensor; and a controller connected to the data collecting device. The controller is configured to calculate an idle operation motor torque during an idle operation of the passenger conveyor based on current and temperature detected during the idle operation; and determine that a fault exists in the passenger conveyor when a difference between the idle operation motor torque and a reference motor torque exceeds a predetermined threshold.

9 Claims, 6 Drawing Sheets

(56) References Cited

U.S. PATENT DOCUMENTS

| 2012/0001574 | A1* | 1/2012 | Akaishi | H02P 21/06 318/400.04 |
| 2012/0092492 | A1 | 4/2012 | Carbonell et al. | |
| 2015/0274490 | A1 | 10/2015 | Vlad | |

FOREIGN PATENT DOCUMENTS

| CN | 102556824 A | 7/2012 |
| CN | 103318739 A | 9/2013 |
| CN | 203319488 U | 12/2013 |
| DE | 19540415 A1 | 6/1997 |
| DE | 20313375 U1 | 10/2003 |
| DE | 102007000449 A1 | 3/2008 |
| EP | 1013599 A1 | 6/2000 |
| JP | 2002160884 A | 6/2002 |
| JP | 2008168974 A | 7/2008 |
| WO | 2013092373 A1 | 6/2013 |
| WO | 2015168204 A1 | 11/2015 |

OTHER PUBLICATIONS

Cundall, "Vertical Transportation", available at http://www.cundall.com/Services/Vertical-transportation.aspx, accessed Jul. 11, 2016, 2 pages.

* cited by examiner

MONITORING SYSTEM FOR A PASSENGER CONVEYOR

BACKGROUND OF THE INVENTION

The present invention generally relates to a passenger conveyor and, more particularly, to a monitoring system for a passenger conveyor.

Passenger conveyors such as escalators and moving walkways are used to transport passengers between different locations of a building. To ensure proper operation of the passenger conveyors, the conveyors require periodic maintenances.

However, such maintenances may not reflect the actual use conditions of the passenger conveyors; therefore, maintenances may be sometimes performed unnecessarily. Also, even with periodic maintenances, it may be difficult to find faulty components of passenger conveyors such as a motor and an inverter, etc.

SUMMARY OF THE INVENTION

According to one embodiment of the invention, a monitoring system for a passenger conveyor is provided. The passenger conveyor has a motor for driving the passenger conveyor and an inverter for supplying current to the motor. The monitoring system includes a current sensor for detecting the current supplied to the motor; a temperature sensor for detecting the temperature of the motor; a data collecting device for receiving detected data from the current sensor and the temperature sensor; and a controller connected to the data collecting device. The controller calculates an idle operation motor torque during an idle operation of the passenger conveyor based on current and temperature detected during the idle operation. Then, the controller determines that a fault exists in the passenger conveyor when a difference between the idle operation motor torque and a reference motor torque exceeds a predetermined threshold.

According to another embodiment of the invention, the controller reports the fault when determining that the fault exists in the passenger conveyor.

According to another embodiment of the invention, the reference motor torque is calculated based on current and temperature detected when the passenger conveyor is installed.

According to another embodiment of the invention, the current sensor is provided in the inverter.

According to another embodiment of the invention, a monitoring system for a passenger conveyor is provided. The passenger conveyor has a motor for driving the passenger conveyor and an inverter for supplying current to the motor. The monitoring system includes a current sensor for detecting the current supplied to the motor; a temperature sensor for detecting the temperature of the motor; a data collecting device for receiving detected data from the current sensor and the temperature sensor; and a controller connected to the data collecting device. The controller calculates an idle operation motor torque during an idle operation of the passenger conveyor based on current and temperature detected during the idle operation and calculates a normal operation motor torque during a normal operation of the passenger conveyor based on current and temperature detected during the normal operation. Then the controller estimates the number of passengers using the passenger conveyor during the normal operation based on a difference between the idle operation motor torque and the normal operation motor torque.

According to another embodiment of the invention, the controller integrates differences between the idle operation motor torque and the normal operation motor torque for a predetermined period of time and requests the maintenance of the passenger conveyor when an integrated value exceeds a predetermined threshold.

According to another embodiment of the invention, the current sensor is provided in the inverter.

According to another embodiment of the invention, a method for monitoring a passenger conveyor is provided. The passenger conveyor has a motor for driving the passenger conveyor and an inverter for supplying current to the motor. The method includes detecting the current supplied to the motor from the inverter; detecting the temperature of the motor; calculating a reference motor torque based on current and temperature detected when the passenger conveyor is installed; calculating an idle operation motor torque during an idle operation of the passenger conveyor based on current and temperature detected during the idle operation; and determining whether a fault exists in the passenger conveyor by comparing the idle operation motor torque with the reference motor torque.

According to another embodiment of the invention, the method further includes reporting the fault when the fault exists in the passenger conveyor as a result of the determining.

According to another embodiment of the invention, a method for monitoring a passenger conveyor is provided. The passenger conveyor has a motor for driving the passenger conveyor and an inverter for supplying current to the motor. The method includes detecting the current supplied to the motor from the inverter; detecting the temperature of the motor; calculating an idle operation motor torque during an idle operation of the passenger conveyor based on current and temperature detected during the idle operation; calculating a normal operation motor torque during a normal operation of the passenger conveyor based on current and temperature detected during the normal operation; and estimating the number of passengers using the passenger conveyor during the normal operation based on a difference between the idle operation motor torque and the normal operation motor torque.

According to another embodiment of the invention, the method further includes integrating differences between the idle operation motor torque and the normal operation motor torque for a predetermined period of time; and requesting the maintenance of the passenger conveyor when an integrated value exceeds a predetermined threshold.

The foregoing and other objects, features and advantages of the present invention become more apparent in light of the following detailed description of the exemplary embodiments thereof, as illustrated in the accompanying drawings.

DETAILED DESCRIPTION

Figure 1:
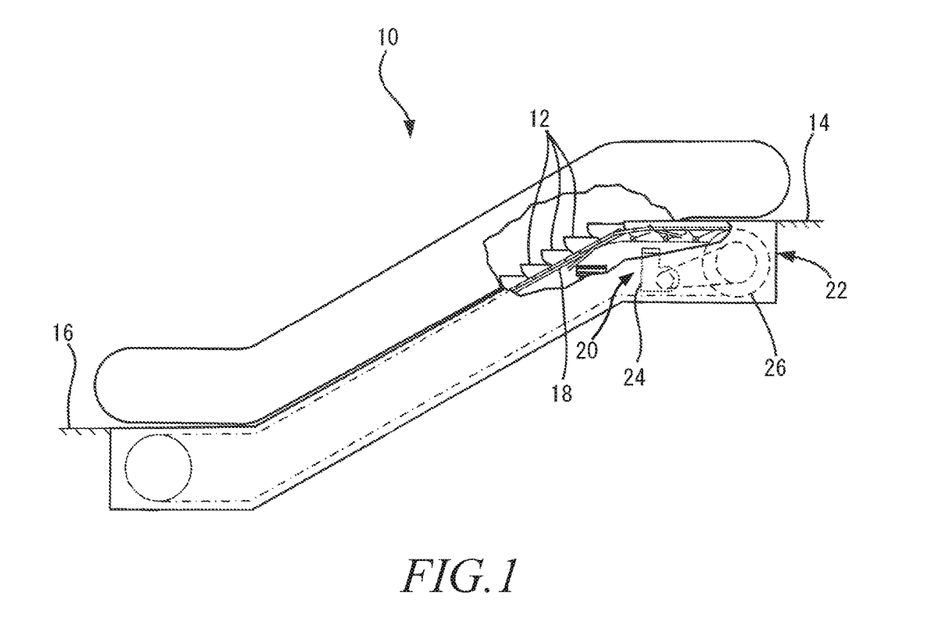
FIG. 1 is a schematic elevational view of an escalator.

A passenger conveyor illustrated as an escalator 10 in FIG. 1 includes a plurality of steps 12 extending between an upper landing 14 and a lower landing 16, a step chain 18 connected to the steps 12, and an escalator drive 20 housed within a machine room 22 located beneath the upper landing 14. The drive 20 includes a motor 24, which drives a drive sprocket 26 located in the upper machine room 22. The drive sprocket 26 imparts forward motion to the step chain 18 so that the steps 12 travel along a closed loop.

The escalator 10 also includes an escalator controller 28 and an inverter 30 connected to the controller 28, which are housed within the upper machine room 22. The controller 28 drives the motor 24 via the inverter 30 and controls the operation of the escalator 10. The inverter 30 supplies current to the motor 24 in accordance with a control signal from the controller 28.

Figure 2:
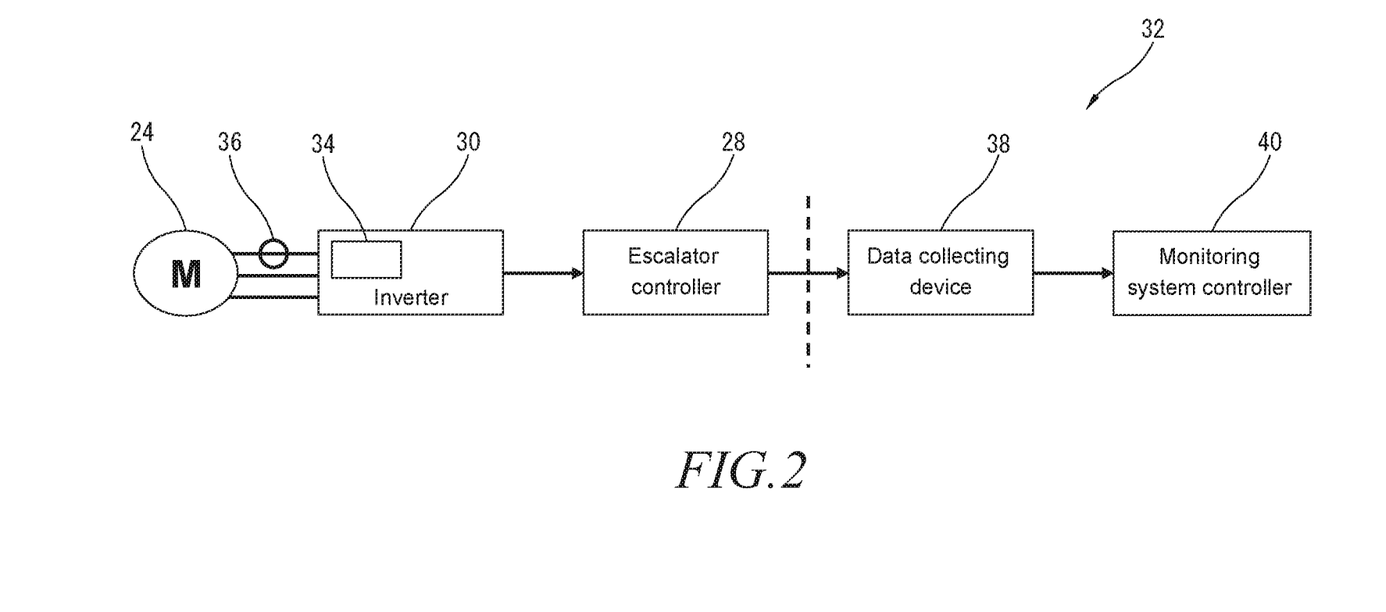
FIG. 2 shows a monitoring system for an escalator according to an embodiment of the invention.

FIG. 2 shows an escalator monitoring system 32 including a current sensor 34, a temperature sensor 36, a data collecting device 38 and a controller 40 for the monitoring system 32. The current sensor 34 detects current supplied to the motor 24 from the inverter 30. In one embodiment, the current sensor 34 is provided in the inverter 30. Alternatively, the current sensor 34 may be provided in other locations such as to detect current supplied to the motor 24. The temperature sensor 36 detects the temperature of the motor 24. The data collecting device 38 is connected to the escalator controller 28 and housed within the upper machine room 22. The data collecting device 38 receives current data from the current sensor 34 and temperature data from the temperature sensor 36.

The controller 40 (hereinafter also referred to as the monitoring system controller 40) is connected to the data collecting device 38 and uses inputs from the sensors 34, 36 to calculate the torque of the motor 24. Specifically, the monitoring system controller 40 calculates a reference motor torque, an idle operation motor torque and a normal operation motor torque of the motor 24. The reference motor torque is a torque of the motor 24, for example, when the escalator 10 is newly installed (i.e. during an operation of the newly installed escalator 10 without passengers) and calculated based on current and temperature detected by the sensors 34, 36 during the operation of the newly installed escalator 10. The idle operation motor torque is a torque of the motor 24 during an idle operation of the escalator 10 without passengers and calculated based on current and temperature detected during the idle operation. The normal operation motor torque is a torque of the motor 24 during a normal operation of the escalator 10 and calculated based on current and temperature detected during the normal operation. The monitoring system controller 40 determines that a fault exists in the escalator 10 when a difference between the idle operation motor torque and the reference motor torque exceeds a predetermined threshold, which will be described hereinafter with reference to the flowchart shown in FIG. 5. In addition, the monitoring system controller 40 estimates the number of passengers who use the escalator 10 during the normal operation based on differences between the idle operation motor torque and the normal operation motor torque, which will be described hereinafter with reference to the flowchart shown in FIG. 6.

Figure 3:
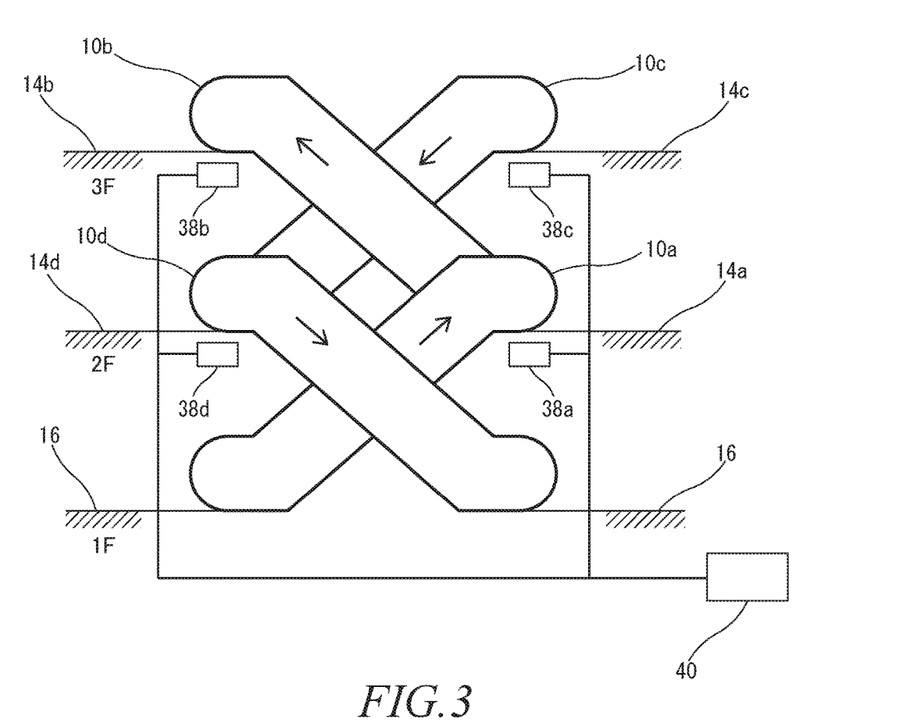
FIG. 3 shows an embodiment of the monitoring system applied to a three-story building including four escalators.
Figure 4:
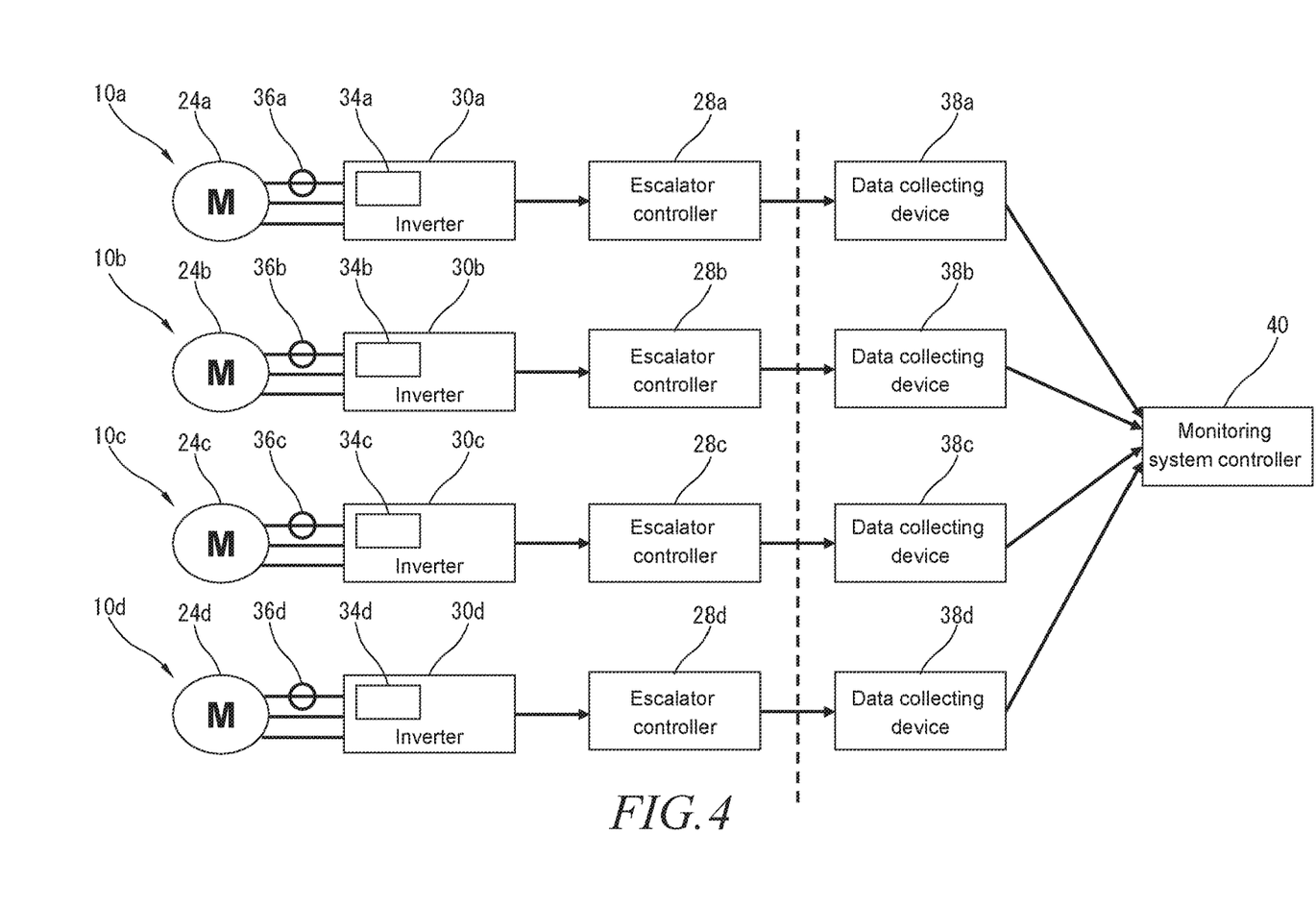
FIG. 4 shows an embodiment of the monitoring system applied to the four escalators.

FIGS. 3, 4 show an embodiment of the escalator monitoring system 32 applied to a three-story building which includes four escalators 10a-10d. The first escalator 10a and the second escalator 10b travel upward from the first floor (i.e. lobby floor) to the second floor and from the second floor to the third floor, respectively. The third escalator 10c and the fourth escalator 10d travel downward from the third floor to the second floor and from the second floor to the first floor, respectively. Each of the escalators 10a-10d includes the motor 24a-24d, the temperature sensor 36a-36d, the inverter 30a-30d, the current sensor 34a-34d and the data collecting device 38a-38d as shown in FIG. 4. As described above, each data collecting device 38a-38d is housed within the machine room 22 at the upper landing 14a-14d of each escalator 10a-10d. As shown in FIG. 4, the monitoring system controller 40 collectively receives current data and temperature data of the four escalators 10a-10d via the four data collecting devices 38a-38d and monitors the conditions of all escalators 10a-10d. Alternatively, one data collecting devices 38 may be provided for the four escalators 10a-10d to collectively receive current data and temperature data of the escalators 10a-10d from the current sensor 34a-34d and the temperature sensor 36a-36d, respectively.

Figure 5:
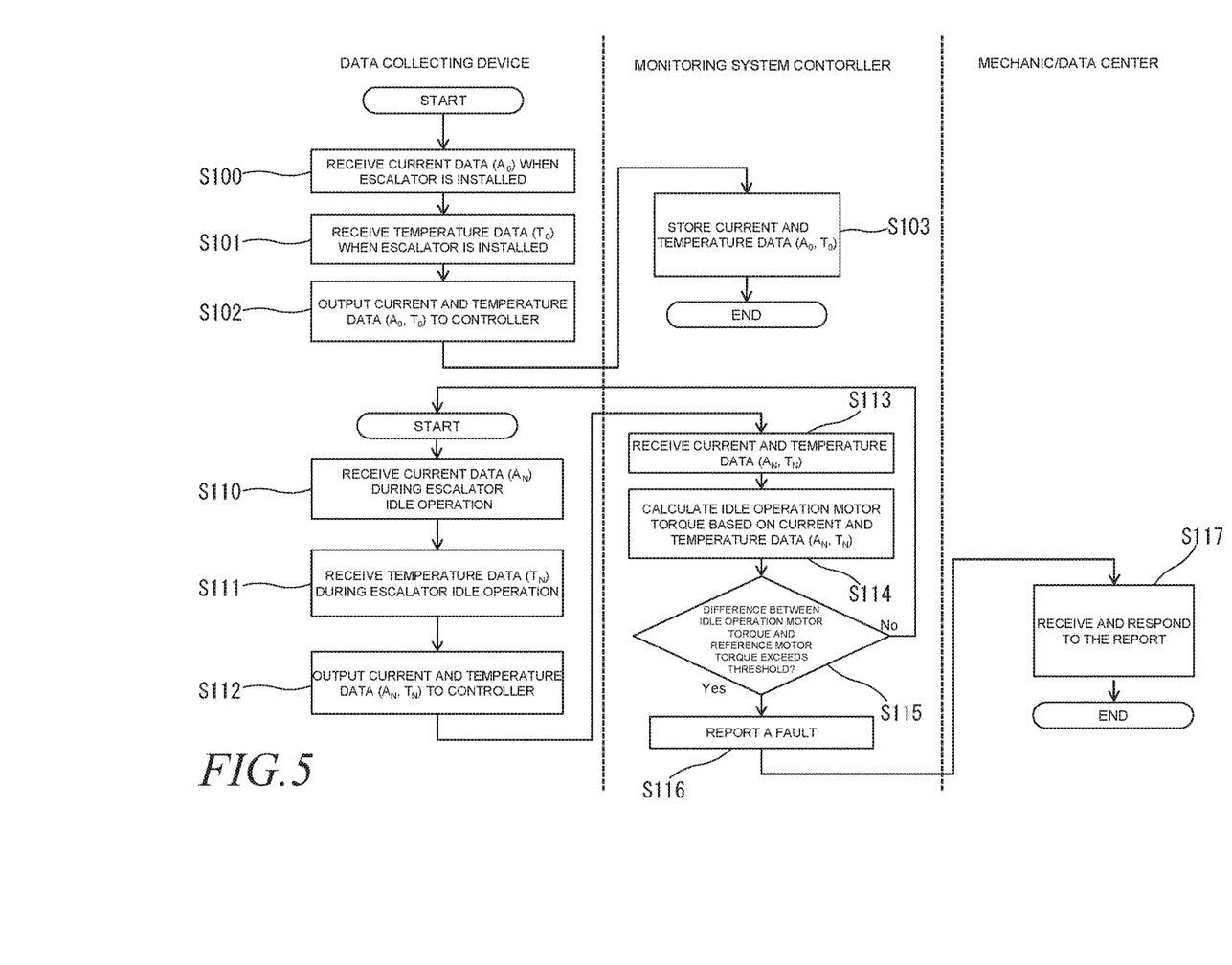
FIG. 5 is a flowchart showing a procedure of the fault detection of the escalator according to an embodiment of the invention.

FIG. 5 is a flowchart showing a procedure of a fault detection of the escalator 10. In Step 100, the current sensor 34 detects current ($A_O$) of the motor 24 when the escalator 10 is newly installed and the data collecting device 38 receives current data ($A_O$) from the current sensor 34. In Step 101, simultaneously with the current detection, the temperature sensor 36 detects temperature ($T_O$) of the motor 24 corresponding to the current ($A_O$) and the data collecting device 38 receives temperature data ($T_O$) from the temperature sensor 36. In Step 102, the data collecting device 38 outputs the current and temperature data ($A_O$, $T_O$) to the monitoring system controller 40. Then, the monitoring system controller 40 stores the current and temperature data ($A_O$, $T_O$) in Step 103.

In Step 110, the current sensor 34 periodically detects current ($A_N$) of the motor 24 during an idle operation of the escalator 10 i.e. when there are no passengers (after the building is closed, for example) and the data collecting device 38 receives current data ($A_N$) from the current sensor 34. In Step 111, simultaneously with the current detection, the temperature sensor 36 periodically detects temperature ($T_N$) of the motor 24 corresponding to the current ($A_N$) and the data collecting device 38 receives temperature data ($T_N$) from the temperature sensor 36. The periodic detections by the sensors 34, 36 may be performed once a week or once a month, for example. In Step 112, the data collecting device 38 outputs the current and temperature data ($A_N$, $T_N$) to the monitoring system controller 40 and the controller 40 receives the current and temperature data ($A_N$, $T_N$) in Step 113.

In Step 114, the monitoring system controller 40 calculates the idle operation motor torque by multiplying the current ($A_N$) by a temperature coefficient ($K_{tempN}$) obtained from the temperature data ($T_N$). The monitoring system controller 40 also calculates the reference motor torque by multiplying the current ($A_O$) by a temperature coefficient ($K_{tempO}$) obtained from the temperature data ($T_O$). Alternatively, the calculation of the reference motor torque may be performed when the current and temperature data ($A_O$, $T_O$) are stored in Step 103. Then, the monitoring system controller 40 compares the idle operation motor torque with the reference motor torque in Step 115. In Step 115, if the difference between the reference motor torque and the idle operation motor torque exceeds a predetermined threshold, the monitoring system controller 40 determines that a fault exists in the escalator 10 and reports the fault, in Step 116, to a mechanic, a technician and/or a monitor center located remote from the building through networks, data communication systems, Internet or emails, etc. In Step 117, the mechanic, the technician and/or the monitor center receives the report and responds to it by repairing or replacing faulty components, for example. If the difference does not exceed the predetermined threshold, the flow returns to Step 110. In an embodiment including a plurality of escalators 10 as shown in FIG. 3, the fault detection is performed for all escalators 10 installed in a building.

Figure 6:
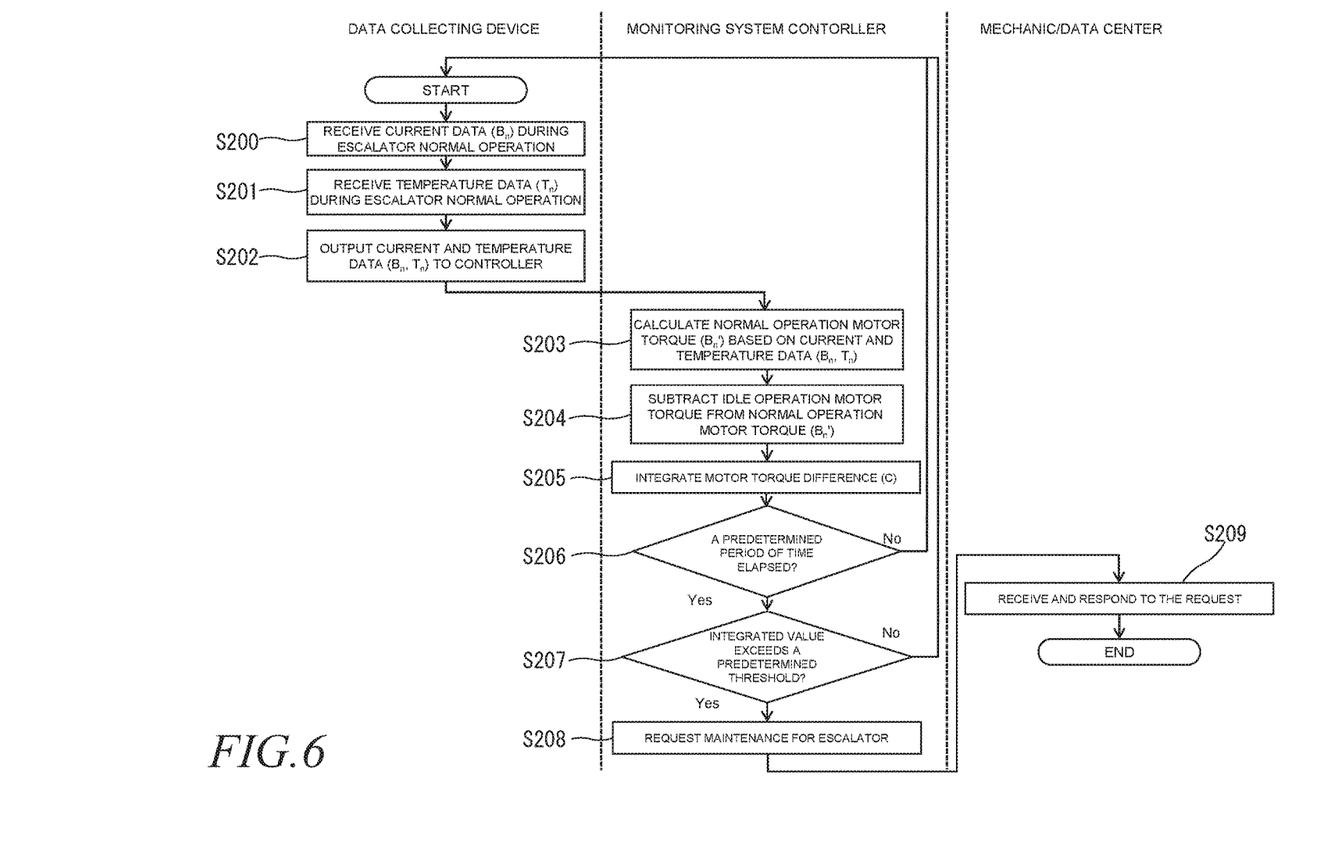
FIG. 6 is a flowchart showing a procedure of the use frequency detection of the escalator according to an embodiment of the invention.

FIG. 6 is a flowchart showing a procedure of the use frequency detection of the escalator 10. The flow from Step 200 to Step 209 is periodically executed, for example every one to ten seconds. In Step 200, the current sensor 34 periodically detects current ($B_n$) of the motor 24 during a normal operation of the escalator 10 and the data collecting device 38 receives current data ($B_n$) from the current sensor 34. In Step 201, simultaneously with the current detection, the temperature sensor 36 periodically detects temperature ($T_n$) of the motor 24 corresponding to the current ($B_n$) and the data collecting device 38 receives temperature data ($T_n$) from the temperature sensor 36. In Step 202, the data collecting device 38 outputs the current and temperature data ($B_n$, $T_n$) to the monitoring system controller 40.

In Step 203, the monitoring system controller 40 receives the current and temperature data ($B_n$, $T_n$) and calculates the normal operation motor torque ($B_n'$) of the motor 24 by multiplying the current ($B_n$) by a temperature coefficient ($K_{tempn}$) obtained from the temperature data ($T_a$). The monitoring system controller 40 also calculates the idle operation motor torque by multiplying the current ($A_N$) detected during the idle operation of the escalator 10 by a temperature coefficient ($K_{tempN}$) obtained from the temperature data ($T_N$) detected during the idle operation as described with regard to Step 114 of the flow shown in FIG. 5. In Step 204, the monitoring system controller 40 subtracts the idle operation motor torque from the normal operation motor torque ($B_n'$) to obtain a motor torque difference (C). The motor torque difference (C) corresponds to the number of passengers using the escalator 10 during the normal operation.

In Step 205, the monitoring system controller 40 integrates motor torque differences (C) obtained for a predetermined period of time. Alternatively, the monitoring system controller 40 may integrate the normal operation motor torques ($B_n'$) for the predetermined period of time. In Step 206, the monitoring system controller 40 determines whether the predetermined period of time is elapsed. If it is not elapsed, the flow returns to Step 200. If it is elapsed, the monitoring system controller 40 compares the integrated value with a predetermined threshold in Step 207. If the integrated value exceeds the predetermined threshold, the monitoring system controller 40 requests the maintenance for the escalator 10 to a mechanic, a technician or a monitor center located remote from the building through networks, data communication systems, etc. in Step 208. If the integrated value does not exceed the predetermined threshold, the flow returns to Step 200. In Step 209, the mechanic, the technician and/or the monitor center receives the request and responds to the request by performing or scheduling maintenances, for example.

In an embodiment including a plurality of escalators 10 as shown in FIG. 3, the use frequency detection is performed for all escalators 10 installed in a building. In this case, the monitoring system controller 40 prioritizes maintenances to be performed for the escalators 10 by comparing the integrated values of all escalators 10.

According to one embodiment of the invention, the timing of maintenances can be accurately determined; accordingly, unnecessary maintenances and the corresponding service interruptions of the escalators may be avoided or minimized; therefore, the efficiency of the escalators can be maximized. Further, the faulty components such as a motor and an inverter, etc. can be effectively found.

According to another embodiment of the invention, the maintenances for escalators can be prioritized between a plurality of the escalators so that maintenances can be performed for escalators which have higher priority and accordingly maintenances and the corresponding service interruptions of escalators which have lower priority may be avoided or minimized. In addition, the number of the passengers using the escalators can be estimated so that an operator, a building owner and/or a tenant can know the use frequency of the escalators and traffic flow within a building which the escalators are installed and effectively use such data.

It is to be understood that this disclosure should not be limited only to escalators. Moving walkways and other types of passenger conveyors may be substituted for the escalators.

While the present invention has been particularly shown and described with reference to the exemplary embodiment as illustrated in the drawings, it will be recognized by those skilled in the art that various modifications may be made without departing from the spirit and scope of the invention as disclosed in the accompanying claims.

What is claimed is:

1. A monitoring system for an escalator having a motor for driving the escalator and an inverter for supplying current to the motor comprising:

a current sensor for detecting a current supplied to the motor of the escalator;

a temperature sensor for detecting a temperature of the motor of the escalator;

a data collecting device for receiving detected data from the current sensor and the temperature sensor; and a controller connected to the data collecting device, the controller configured to:

calculate an idle operation motor torque of the escalator during an idle operation of the escalator based on the current and the temperature that is detected during the idle operation;

calculate a normal operation motor torque of the escalator during a normal operation of the escalator based on the current and the temperature detected during the normal operation;

estimate a number of passengers who use the escalator during the normal operation based on a difference between the idle operation motor torque of the escalator and the normal operation motor torque of the escalator;

integrate differences between the idle operation motor torque of the escalator and the normal operation motor torque of the escalator for a predetermined period of time to generate an integrated value, wherein the integrated value corresponds to the estimated number of passengers who use the escalator during the normal operation; and transmit a maintenance request over a network to a remotely located monitor center upon detecting by the controller that the integrated value exceeds a predetermined threshold, wherein the remotely located monitor center receives the maintenance request and then responds to the maintenance request by performing maintenance on the escalator.

2. The monitoring system according to claim 1, wherein the controller is configured to determines whether a fault exists in the escalator by comparing the idle operation motor torque with a reference motor torque, and reports the fault upon determining that the fault exists in the escalator.

3. The monitoring system according to claim 2, wherein the reference motor torque of the escalator is calculated based on the current and the temperature that is detected when the escalator is installed.

4. The monitoring system according to claim 1, wherein the current sensor is provided in the inverter.

5. A monitoring system for an escalator having a motor for driving the escalator and an inverter for supplying current to the motor comprising:
   a current sensor for detecting a current supplied to the motor of the escalator;
   a temperature sensor for detecting a temperature of the motor of the escalator;
   a controller configured to:
      calculate an idle operation motor torque of the escalator during an idle operation of the escalator based on the current and the temperature that is detected during the idle operation;
      calculate a normal operation motor torque of the escalator during a normal operation of the escalator based on the current and the temperature detected during the normal operation;
      estimate a number of passengers who use the escalator during the normal operation based on a difference between the idle operation motor torque of the escalator and the normal operation motor torque of the escalator;
      integrate differences between the idle operation motor torque of the escalator and the normal operation motor torque of the escalator for a predetermined period of time to generate an integrated value, wherein the integrated value corresponds to the estimated number of passengers who use the escalator during the normal operation; and
      transmit a maintenance request over a network to a remotely located monitor center upon detecting by the controller that the integrated value exceeds a predetermined threshold, wherein the remotely located monitor center receives the maintenance request and then responds to the maintenance request by performing maintenance on the escalator.

6. The monitoring system according to claim 5, wherein the current sensor is provided in the inverter.

7. A method for monitoring an escalator having a motor for driving the escalator and an inverter for supplying current to the motor comprising:
   detecting, by a controller of a monitoring system, the current supplied to the motor from the inverter;
   detecting, by the controller, the temperature of the motor;
   calculating, by the controller, an idle operation motor torque of the escalator during an idle operation of the escalator based on the current and the temperature that is detected during the idle operation;
   calculating, by the controller, a normal operation motor torque of the escalator during a normal operation of the escalator based on the current and the temperature that is detected during the normal operation;
   estimating, by the controller, the number of passengers who use the escalator during the normal operation based on a difference between the idle operation motor torque and the normal operation motor torque;
   integrating, by the controller, differences between the idle operation motor torque of the escalator and the normal operation motor torque of the escalator for a predetermined period of time to generate an integrated value, wherein the integrated value corresponds to the estimated number of passengers who use the escalator during the normal operation; and
   upon detecting by the controller that the integrated value exceeds a predetermined threshold, transmitting, by the controller, a maintenance request over a network to a remotely located monitor center, wherein the remotely located monitor center receives the maintenance request and then responds to the maintenance request by performing maintenance on the escalator.

8. The method according to claim 7 further comprising:
   calculating, by the controller, a reference motor torque of the escalator based on the current and the temperature that is detected when the escalator is installed;
   determining, by the controller, whether a fault exists in the escalator by comparing the idle operation motor torque with the reference motor torque, and
   reporting, by the controller, the fault when the fault exists in the escalator as a result of the determining.

9. A method for monitoring an escalator having a motor for driving the escalator and an inverter for supplying current to the motor comprising:
   detecting, by a controller of a monitoring system a current supplied to the motor of the escalator from the inverter;
   detecting, by the controller, a temperature of the motor of the escalator;
   calculating, by the controller, an idle operation motor torque of the escalator during an idle operation of the escalator based on the current and the temperature that is detected during the idle operation;
   calculating, by the controller, a normal operation motor torque of the escalator during a normal operation of the escalator based on the current and the temperature that is detected during the normal operation;
   estimating, by the controller, a number of passengers who use the escalator during the normal operation based on a difference between the idle operation motor torque of the escalator and the normal operation motor torque of the escalator;
   determining, by the controller, whether a fault exists in the escalator by comparing the idle operation motor torque with a reference motor torque;
   integrating, by the controller, differences between the idle operation motor torque of the escalator and the normal operation motor torque of the escalator for a predetermined period of time to generate an integrated value, wherein the integrated value corresponds to the estimated number of passengers who use the escalator during the normal operation; and
   upon detecting by the controller that the integrated value exceeds a predetermined threshold, transmitting, by the controller, a maintenance request over a network to a remotely located monitor center, wherein the remotely located monitor center receives the maintenance request and then responds to the maintenance request by performing maintenance on the escalator.

* * * * *